United States Patent [19]

Miyazaki et al.

[11] 4,387,469
[45] Jun. 7, 1983

[54] TUNER CONTROL SYSTEM

[75] Inventors: Takao Miyazaki; Satoru Tazaki, both of Toda, Japan

[73] Assignee: Clarion Co., Ltd., Tokyo, Japan

[21] Appl. No.: 267,951

[22] Filed: May 28, 1981

[30] Foreign Application Priority Data

Jun. 3, 1980 [JP] Japan .................................. 55-75080
Jun. 3, 1980 [JP] Japan .................................. 55-75081

[51] Int. Cl.³ ........................... H04B 1/26; H03J 7/28
[52] U.S. Cl. ................................... 455/161; 455/165; 455/194
[58] Field of Search ............... 455/164, 165, 169, 186, 455/218, 219, 222, 225, 223, 224, 161, 194; 358/193.1

[56] References Cited

U.S. PATENT DOCUMENTS

| 3,062,644 | 6/1962 | Baker | 455/165 |
| 3,889,192 | 6/1975 | Schiebelhuth et al. | 455/222 |
| 4,156,196 | 5/1979 | Someno et al. | 455/169 |
| 4,174,501 | 11/1979 | Chastagnier et al. | 455/161 |
| 4,245,348 | 1/1981 | Imazeki | 455/165 |

Primary Examiner—Marc E. Bookbinder
Attorney, Agent, or Firm—Flynn, Thiel, Boutell & Tanis

[57] ABSTRACT

An automatic tuner control system characterized in that the device comprises a detector for detecting a signal level in a radio receiver, a means for setting a reference signal level and a comparator means for doing comparison between the signal level and the reference signal level. Thus, the device is arranged to switch the received waves of the radio receiver in response to the result of the comparison in the comparator means and various conditions.

3 Claims, 5 Drawing Figures

TUNER CONTROL SYSTEM

BACKGROUND OF THE INVENTION

1. Field of the Invention

This invention relates to a tuner control system and more specifically to an improvement in an automatic tuner control system in which when a station broadcasts a program in several waves (i.e. frequencies or wavelengths), the device automatically selects one of those waves which is at a higher level than a predetermined reference level, thus being in a well receivable condition.

2. Description of the Prior Art

In a conventional automatic tuner, there has been proposed a so-called "frequency diversity system" for switching waves by detecting an electric field intensity or a noise level to thereby compare them with respective reference levels.

However, such conventional system has various problems because it carries out the wave switching with a simple judgement of the result of the comparison with the above described reference level. Particularly, when it is adopted in a short-wave broadcasting with a large fading, the wave switching frequently takes place, thus to frequently interrupt the reproduced sound every time the wave switching occurs.

Conventionally, there has also been proposed another system in which there are provided a plurality of receivers in order to carry out the wave switching by comparing the outputs of these receivers therebetween.

However, the above system has drawbacks regarding its production cost and space, considering that such system should generally be mounted in a radio set for a common use which is generally small in size.

OBJECTS OF THE INVENTION

It is therefore an object of the present invention to provide a tuner control system capable of switching waves at a certain timing relative to wave conditions, but not switching with a mere comparison between a signal (S) level and a predetermined reference level. That is, when all waves are in bad conditions, the device receives a wave which appears to have the largest electric field intensity after detecting all the waves, and thereafter, a further wave switching hardly takes place for a predetermined time.

SUMMARY OF THE INVENTION

In accordance with the present invention, there is provided a tuner control system which comprises:

a radio receiver means;

a detector for detecting a signal level of a wave received by said radio receiver means;

a means for setting a reference signal level;

a comparator means for comparing a detected signal level with said reference signal level;

a switching means for switching tuning frequency of waves received by said radio receiver means; and, a control means for controlling the operation of said switching means in response to a result of the comparison in said comparator means and to a predetermined wave condition.

DETAILED DESCRIPTION OF THE PREFERRED EMBODIMENTS

Figure 1:
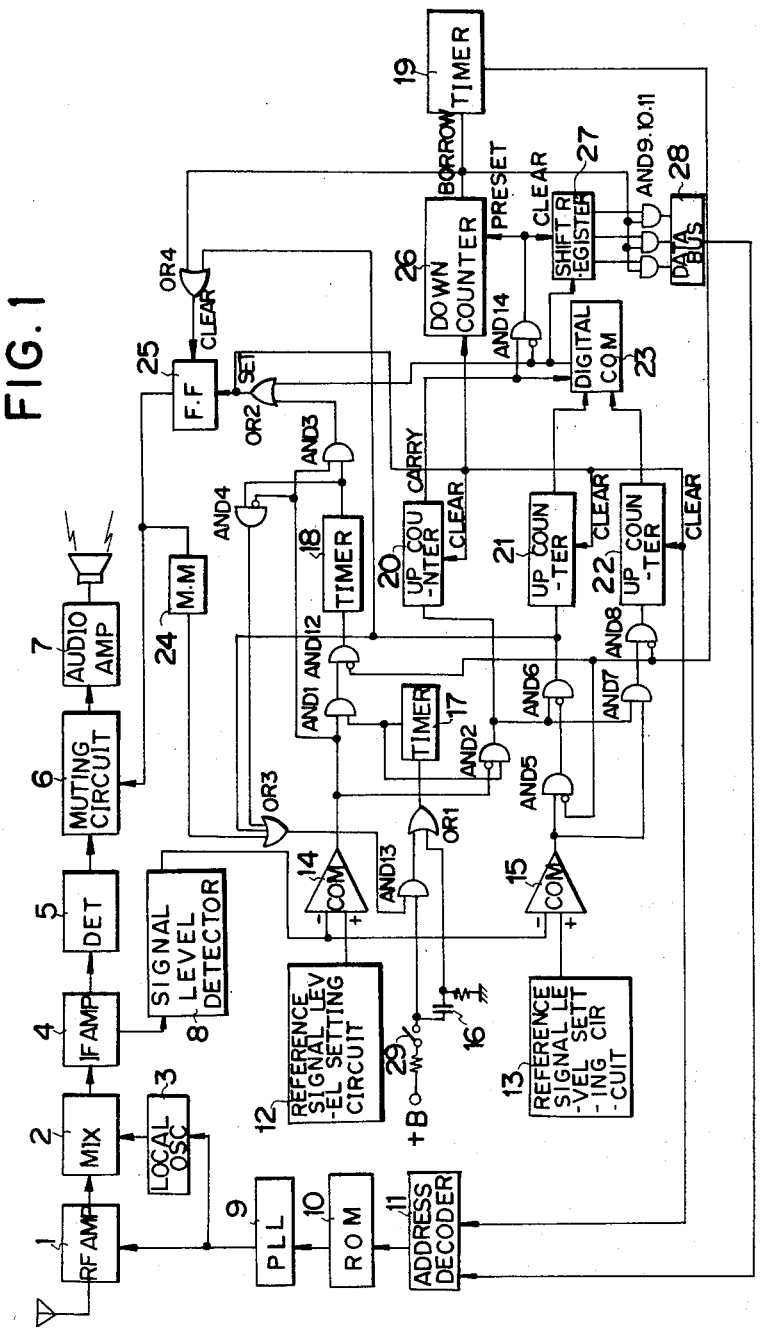
FIG. 1 is a schematic diagram of an embodiment according to the present invention.

The present invention will now be described in detail referring to the preferred embodiments as shown in the drawings.

FIG. 1 shows an embodiment according to the present invention provided in a radio receiver comprising a PLL synthesizer circuit. In FIG. 1 the reference numeral 1 designates a high frequency amplifier, 2 a mixer, 3 a local oscillator, 4 a medium frequency amplifier, 5 a frequency detector, 6 a muting circuit, 7 a voice amplifier, respectively, and those above members construct a radio receiver as conventionally known with voice amplifier 7 driving a speaker or the like as shown.

Further, the reference numeral 9 designates a PLL circuit, 10 a memory circuit (ROM) for reading the PLL data, 11 an address decoder for the ROM, 10, 12 and 13 reference signal level setting circuits, 14 and 15 comparators, 16 a differentiation circuit, 17, 18 and 19 timers, 20, 21 and 22 up-counters, 23 a digital comparator, 24 a mono-multi-vibrator, 25 a flip-flop circuit, 26 a down-counter, 27 a shift register, 28 a data bus, 29 an automatic-mode switch, $AND_1$–$AND_{14}$ AND circuits, and, $OR_1$–$OR_4$ OR circuits, respectively.

There are short wave radio braodcastings, for example, which broadcast a program in several waves. The waves of such short wave radio broadcastings have characteristic fading and therefore it is sometimes undesirable to carry out comparison of the S level in an instant manner for selecting a wave in a well receivable condition.

That is, when the reference S level is set at 40 dB, for example, there is no need of switching waves upon instantaneous fading F, and on the other hand, the wave switching is required upon long-period fadings. Further, when the reference S level is set at 20 dB, if a received level is lower than 20 dB and is therefore a bad receivable condition, the wave has to be switched. Therefore, it is necessary to provide a circuit for automatically selecting a better wave in consideration of characteristic wave conditions of short waves.

According to the present invention, two reference levels, high and low, which are compared with the S level are set in the reference level setting circuits 12, 13. Those two reference levels may be set at 40 dB and 20 dB, for example. Then, the reference levels are applied to the comparators 14, 15 to be thereby compared with outputs from the detector 8 which detects an S level. In this case, the comparator 14 is supplied with the reference S level (about 20 dB, for example, which is a value in which the signal is so weak that the reproduced voice can hardly be heard) by the reference S level setting circuit 12.

When the automatic mode switch 29 is turned on, the device is set in its automatic detecting mode. Then, a pulse from the differentiation circuit 16 triggers the timer 17 through the OR circuit $OR_1$ to allow the timer 17 to produce an output pulse after a predetermined time.

On this occasion, since S levels have been compared with the lower reference S level in the comparator 14, the result is applied to the AND circuits AND$_1$ and AND$_2$ together with the prescribed output to be submitted to judgement. If the S level is lower than the low reference S level, the output of the comparator 14 becomes high, so that the output of the AND circuit AND$_1$ also becomes high to thereby trigger the timer 18. After a predetermined time, the output pulse of the timer 18 and the output of the comparator 14 are applied to the AND circuit AND$_3$ and AND$_4$ to be submitted to judgement again. As a result, if the received S level is lower, the output of the AND circuit AND$_3$ is high, thus to operate the address decoder 11 through the OR circuit OR$_2$. Then the PLL data preliminarily memorized in the ROM 10 is picked up to be applied to the PLL circuit 9, thus, receiving a next wave. Further, the output of the OR circuit OR$_2$ allows the flip-flop circuit 25 to turn on, the output of which causes muting action of the muting circuit 6 at the switching time of the PLL circuit 9.

Incidentally, the timer 18 is provided in order to carry out the wave switching slowly when the condition in which the S level is lower than the low reference S level has been kept for a predetermined time after acknowledging it by looking over if the re-detected S level after a predetermined time by the timer 18 is higher or lower.

When the output of the AND circuit AND$_4$ is high, which means that the S level has become higher, the wave switching is not held and the timer 17 operates again. If the output of the AND circuit AND$_2$ is higher, this means that the S level is higher, thus causing the operation of the comparator 15.

Next, the comparator 15 is supplied with a signal of the high reference S level (40 dB, for example) from the reference S level setting circuit 13. The value of the signal is set at a range in which it cannot clearly be determined whether the wave switching is necessary or not. The output of the comparator 15 is applied to the AND circuit AND$_6$ through the AND circuit AND$_5$. If the S level is higher as a result of the comparison of the S level with the high reference S level, the output of the AND circuit AND$_6$ becomes high, thus not only operating the up-counter 21 to count up but also re-actuating the timer 17 through the OR circuit OR$_3$. Accordingly, the output of the timer 17 is applied to the counter 20 through the AND circuit AND$_2$ to be thereby counted up.

The counter 20 is provided for integrating the output of the timer 17 and arranged to clear its count with a carry when the count reaches a predetermined value.

On the other hand, the up-counter 21 is provided for integrating the result of the comparison is the comparator 15 when the S level is higher.

Further, the up-counter 22 is provided for integrating the result when the S level is lower. More specifically, the result obtained by the comparator 15 when the S level is lower than the high reference S value is counted up by the up-counter 22 through the AND circuits AND$_7$ and AND$_8$.

The data obtained by the integrations of the up-counters 21 and 22 are introduced to the digital comparator 23 by a carry output of the counter 20 to be thereby compared therebetween, whereby the result is put out. That is, the comparator 23 is arranged to apply its output to the OR circuit OR$_2$, and then, the receiver keeps receiving the presently received wave if the occasions in which the S level was higher than the high reference S level have been more often than those in which the S level was lower, and on the other hand, the receiver carries out the changing as described above if the occasions in which the S level was higher than the high reference S level have been less than those in which the S level was lower.

The short wave broadcasting as mentioned above broadcasts each program in 3 modes of frequency. The operation upon carrying out consecutive 3 times wave changing is hereunder described.

In such consecutive 3 times wave changing there are included a case in which the changing is carried out by the judgement of the comparator 14 as shown by (1)–(7) in the following table and a case in which the changing is carried out solely by the judgement of the comparator 15 as shown by (8) in the same table.

| (1) | 30dB | (2) | 30dB | (3) | 10dB | (4) | 10dB |
|---|---|---|---|---|---|---|---|
|  | 30dB |  | 10dB |  | 30dB |  | 10dB |
|  | 10dB |  | 10dB |  | 30dB |  | 30dB |
| (5) | 10dB | (6) | 30dB | (7) | 30dB | (8) | 10dB |
|  | 30dB |  | 10dB |  | 30dB |  | 10dB |
|  | 10dB |  | 30dB |  | 30dB |  | 10dB |

The changing occasions are kept as few as possible by re-receiving the third received wave in case of (3), (4), (6) and (7) in the table, the first received wave in case of (1), (2) and (8), and the second received wave in case of (5), respectively. That is why it had better keep receiving a wave than changing to another because any mode will not be received well in such conditions as shown in (1)–(8).

The operation will now be described hereunder. The down-counter 26 which has preliminarily preset at "2" is counted down by the output of the OR circuit 2. The output of the digital comparator 23 is applied to the shift register 27, whereby what wave it was switched to is memorized with the judgement of the comparator 15. When the switching is carried out three times consecutively to thereby produce a borrow output in the down-counter 26, the borrow output causes the contents of the shift register 27 to be introduced to the address decoder 11 through the AND circuits AND$_9$–AND$_{11}$ and the data bus 28. The address decoder 11 judges what wave is good to be received, and then, the PLL data in response to the address is picked up from the ROM circuit 10 to thereby apply it to the PLL circuit 9, thus to start receiving. The down counter 26 and the shift registor 27 are preset and cleared when the borrow output is produced and when the comparator 15 judges that occasions in which the S level was higher than the high reference S level has been more often than that in which the S level was lower, respectively.

The timer 19 is arranged to operate with the borrow output of the down-counter 26 is order that the switching to a newly received wave does not take place for a predetermined time. That is, in this case, the output of the timer 19 is applied to the negative inputs of the AND circuits AND$_5$ and AND$_8$ to thereby disable the judging result of the comparator 15, and, to the negative input of the AND circuit AND$_{12}$ to thereby disable the judging result of the comparator 14 for a determined time. Those judging results are enabled after the predetermined time.

In (8) of the table there is shown the case in which the change is carried out under the condition that the S level is lower than the low reference S level. In this case, the device is arranged not to change for a predetermined time by returning to a frequency which caused the changing.

The muting is normally cancelled by clearing the flip-flop circuit 25 when the result of the comparator 15 shows "high", and accordingly, the output of the AND circuit $AND_6$ is high. The cancelling of the muting upon newly receiving after the consecutive 3 times switching is carried out by clearing the flip-flop circuit 25 with the borrow output of the down-counter 26 through the OR circuit $OR_4$.

Incidentally, mono-multi-vibrator 24 is provided for operating the timer 17 interposing a predetermined time after the flip-flop circuit 25 has been set.

Figure 2:
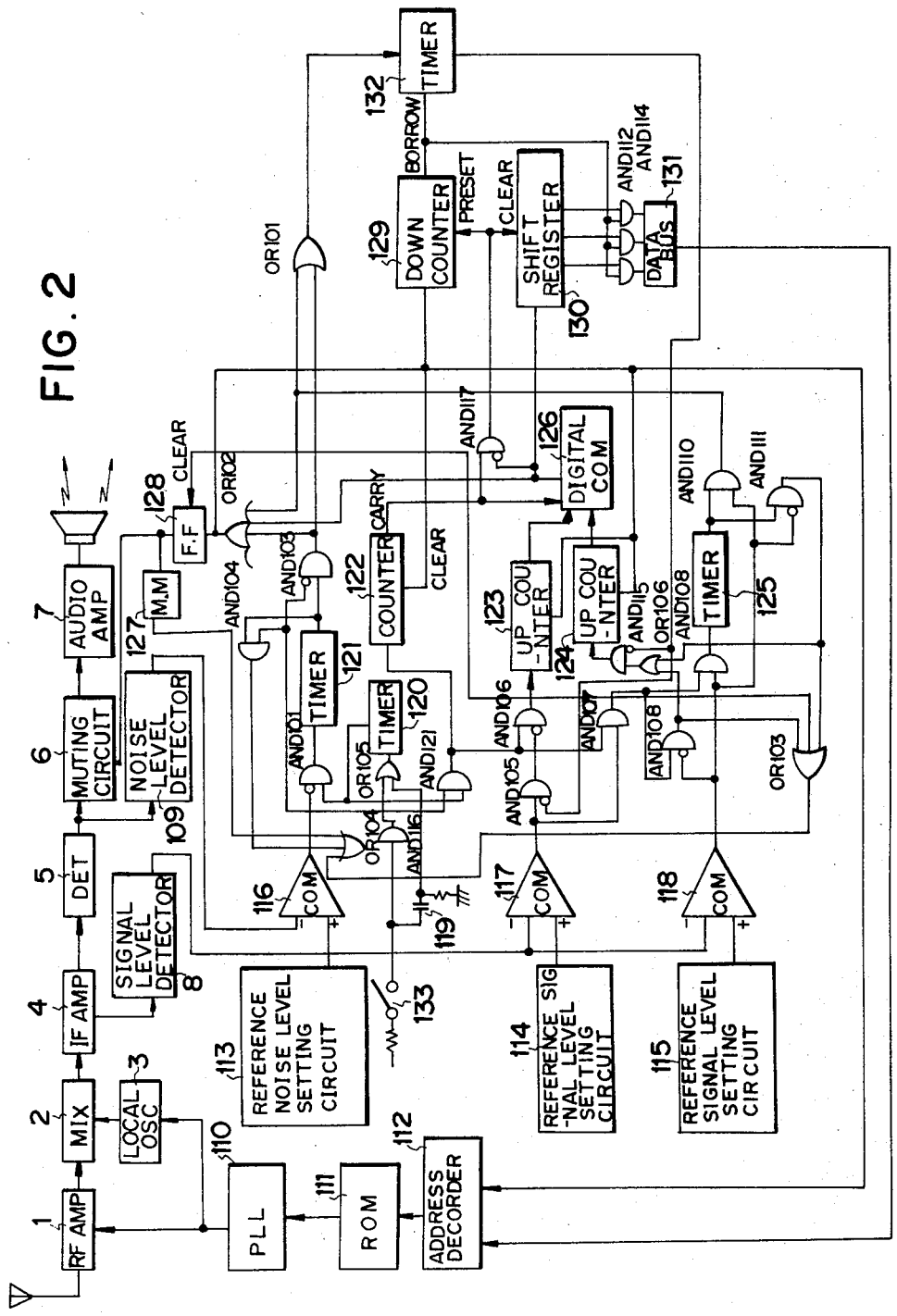
FIG. 2 is a schematic diagram of another embodiment.

FIG. 2 shows another embodiment which is directed to a tuning device capable of switching waves at a certain tuning relative to wave conditions, but not switching with a mere comparison between a signal level (S level) or a noise level (N level) and the respective predetermined reference levels. More specifically, under the condition that all waves are in bad condition, the device keeps receiving a wave under a muting condition when the switching has occurred upon judging that the N level or the reference S level is lower. On the other hand, when the switching has been carried out upon being judged that the reference S level was higher, the device receives the formerly received wave after detecting all the waves, and thereafter, a further switching hardly takes place for a predetermined time.

The reference numeral 109 designates a N level detector which detects sounds in a range which may be regarded as noise out of the range of audio frequencies already detected. The N level detector may be arranged to detect sounds in a level between 8 KHz and 15 KHz, for example, in a short wave radio receiver.

The reference numeral 110 designates a PLL circuit, 111 a memory circuit (ROM) for memorizing the PLL data, 112 an address decoder for the ROM, 113–115 reference level setting circuits, 116–117 comparators, 119 a differentiation circuit, 120, 121, 125 and 132 timers, 122 a counter, 123 and 124 up-counters, 126 a digital comparator, 127 a mono-multi-vibrator, 128 a flip-flop circuit, 129 a down-counter, 130 a shift register, 131 a data bus, 133 an automatic power source switch, $AND_{101}$–$AND_{117}$ AND circuits, and $OR_{101}$–$OR_{106}$ OR CIRCUITS, respectively.

In receiving a short wave radio broadcast, in order to catch a wave having a good S/N value there is sometimes required a comparison of N levels in addition to the comparison of the S levels.

For example as mentioned above, under the condition that the reference S level is set at 40 dB, the wave switching is not required upon instantaneous fadings F. However, it is considered necessary to switch waves when a N level is judged to be higher by comparing it with the reference N level.

Therefore, in the embodiment as shown in FIG. 2, the reference N level and S level setting circuits 113–115 are arranged to set reference levels to be compared with a N level and reference S levels to be compared with a S level at about 40 dB and 20 dB thus to apply them to the comparators 116–118, whereby the reference levels are compared with outputs from the S level detector 8 and the N level detector 109.

If the power source switch 133 is turned on, the device is set in its automatic detecting mode to thereby allow a pulse from the differentiation circuit 119 to trigger the timer 120 through the OR circuit $OR_5$, whereby the timer 120 produces an output pulse after a predetermined time.

In this occasion, since the comparison between the N level and the reference N level has been carried out by the comparator 116, the compared result is applied to the AND circuits AND 101 and AND 102 together with the prescribed output pulse to be thereby judged. Accordingly, when the N level is higher, which means that the output of the comparator 116 is lower, an output of the AND circuit $AND_{101}$ becomes high to thereby trigger the timer 121. After a predetermined time, an output of the timer 121 is applied to the AND circuits $AND_{103}$ and $AND_{104}$ together with the output of the comparator 116 to be re-judged. As a result, when the N level is higher, an output of the AND circuit $AND_{103}$ becomes high to thereby operate the address decoder 112 through the OR circuit $OR_{102}$. Accordingly, PLL data preliminarily stored in the $ROM_{111}$ is read to be thereby put in the PLL circuit, whereby a next wave is received. Further, the output of the OR circuit $OR_{102}$ turns on the flip-flop circuit 128, an output of which operates the muting circuit 106, thus muting the PLL circuit 110 upon its change.

Incidentally, the timer 121 is provided in order to carry out the change only when the N level is lasting for a predetermined time, judging it by acknowledging whether the N level re-detected after a time predetermined by the timer 121 still exists or not.

When the output of the AND circuit $AND_{104}$ is high, which means that the N level no longer exists, the switching is not carried out, thus the timer 120 starts to operate again. When the output of the AND circuit 102 is high, which means that the N level is lower, the comparator 117 starts to operate.

The comparator 117 is provided with a reference S level signal of a high level (40 dB, for example) from the reference S level setting circuit 114. The signal level is a one at which it is not clearly determined whether the switching is required or not. An output of the comparator 117 is applied to the AND circuit $AND_{106}$ through the AND circuit $AND_{105}$. When the S level is higher as a result of the comparison between the S level and the reference S level, an output of the AND circuit $AND_{106}$ becomes high to thereby allow the up-counter 123 to count up as well as to operate timer 120 again through the OR circuit $OR_{103}$. Accordingly, an output of the timer 120 is applied to the counter 122 through the AND circuit $AND_{102}$ to allow the counter 122 to count up.

The counter 122 is provided for integrating the output of the timer 120 and is cleared with a carry when the count reaches a predetermined value.

On the other hand, the up-counter 123 is provided for integrating the result of the comparison by the comparator 117 solely when the S level was higher.

Further, the up-counter 124 is provided for integrating the result of the comparison only when the S level is lower. That is, when the S level is lower than the reference S level (but higher than the reference S level applied to the comparator 118) as a result of the comparison in the comparator 117, the compared result is counted up in the up-counter 124 through the AND circuits $AND_{107}$ and $AND_{108}$. Counted data obtained by the integral in the up-counters 123 and 124 are introduced to the digital comparator 126 by a carry output of the counter 122 to be thereby submitted to comparison. The result of the comparison is thereafter put out.

That is, the digital comparator 126 is arranged to apply its output to the OR circuit OR$_{102}$, whereby the device keeps receiving without switching waves when the result of the comparison in the comparator 117 represents S level≧reference S level, and, the device proceeds to its change action as mentioned above upon S level<reference S level.

On the other hand, the comparator 118 is provided with a signal of a low level (20 dB, for example, which is a level at which the signal is so weak that the reproduced sound cannot be heard well) from the reference S level setting circuit 115. The compared result of it is applied to the AND circuit AND$_{109}$. When an output of the AND circuit AND$_{109}$ becomes high, the output triggers the timer 125, and after a predetermined time, an output of the timer 125 is applied to the AND circuits AND$_{110}$ and AND$_{111}$ together with the prescribed compared result to thereby allow the AND circuit AND$_{110}$ to apply its output to the OR circuit OR$_2$. Thus, the device carries out the switching when it is judged that the condition in which the S level is lower is lasting in the same manner as the judgment of the N level.

The above mentioned short wave broadcasting is broadcasted in 3 waves. The operation in carrying out consecutive 3 times switching of such 3 waves will now be hereunder described.

When the change is carried out by the comparison by the comparators 116 and 117, the device repeats its switching action searching for a more intensive wave and a wave with a lower N level. In this case, since the muting circuit 106 is kept on by the output of the flip-flop circuit 128, no sound output comes out of the speaker.

In cases that the consecutive 3 times switching takes place there is included a case that the change is carried out by the judgment of the comparator 118.

For example, the following 7 cases may be referred to:

| (1) | 30dB | (2) | 30dB | (3) | 10dB | (4) | 10dB |
|---|---|---|---|---|---|---|---|
|  | 30dB |  | 10dB |  | 30dB |  | 10dB |
|  | 10dB |  | 10dB |  | 30dB |  | 30dB |
| (5) | 10dB | (6) | 30dB | (7) | 30dB | | |
|  | 30dB |  | 10dB |  | 30dB | | |
|  | 10dB |  | 30dB |  | 30dB | | |

In the above example, occasions of the switching is minimized as far as possible by re-receiving the third received station in case of (3), (4), (6) and (7) of the table, the first received staion in case of (1) and (2), and, the second received station in case of (5), respectively. That is why it is preferred to keep a wave unchanged rather than changing it because any wave cannot be received well under such conditions as shown in (1)–(7) of the table.

The operation proceeds as follows. The down-counter 129 which has preliminarily been preset at "2" by the OR circuit OR$_{102}$ is counted down. The shift register 130 is arranged to be provided with the output of the digital comparator 126, to thereby memorize what wave it is changed to. When the switching takes place 3 times consecutively as mentioned above and a borrow output of the down-counter 129 is produced, the borrow output is applied to the address decoder 112 by way of the AND circuits AND$_{112}$–AND$_{114}$ and the data bus 131. The address decoder 112 judges what wave should be received. PLL data in response to the address is picked up from the ROM$_{111}$ to be thereafter applied to the PLL circuit, thereby receiving the judged wave. The down-counter 129 and the shift register 130 is preset and cleared when the borrow output is produced and when the S level is judged higher than the reference S level in the comparator 117, respectively.

The timer 132 is arranged to operate with the borrow output of the down-counter 129 in order to possibly avoid a switching to a wave formerly received and having caused the switching. That is, since the output of the timer 132 is applied to the negative inputs of the AND circuits AND$_5$ and AND$_{15}$ in the above case, the judged result of the comparator 117 is disabled for a predetermined time and thereafter enabled.

Further, when receiving of a wave is stopped, if the N level becomes high and the S level becomes lower than the reference S level in the reference level setting circuit, the switching is carried out by clearing the timer 132 by the output of the OR circuit OR$_{104}$.

As to the cancelling of muting, the muting circuit 106 is arranged to continue its operation with the output of the flip-flop circuit 128 when the device repeats its switching action with the judged result of the comparators 116 and 118, but it is cancelled at the moment when the output of the AND circuit AND$_{106}$ reaches high when the judged result of the comparator 117 is "impossible".

Incidentally, the mono-multi-vibrator 127 is provided for operating the timer 120 interposing a predetermined time after the flip-flop circuit 128 has been set.

Figure 3:
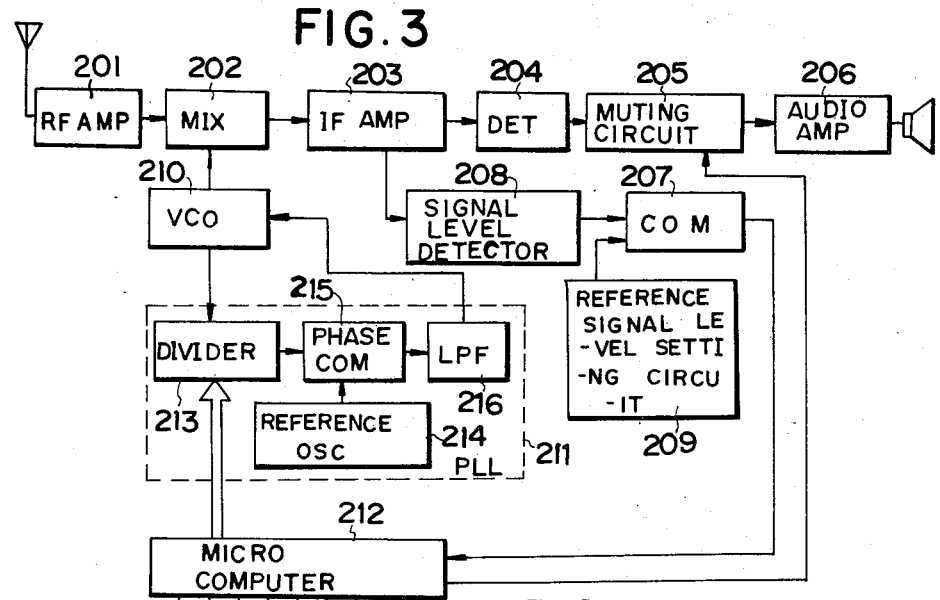
FIG. 3 is a schematic diagram of a further embodiment.

FIG. 3 shows a further embodiment according to the present invention in which there is provided a microcomputer for carrying out a tuning control.

In FIG. 3, the reference numeral designates a high frequency amplifier, 202 a mixer, 203 a medium frequency amplifier, 204 a detector, 205 a muting circuit, 206 an audio amplifier, 207 a comparator, 208 a signal level detector, 209 a reference signal level setting circuit, 210 a voltage control oscillator, 211 a PLL circuit, and, 212 a microcomputer, respectively.

The PLL circuit 211 comprises a frequency divider 213, a reference frequency oscillator 214, a phase comparator 215 and a low pass filter 216. The microcomputer 212 has an integral circuit comprising a read only memory (ROM), a random-access memory (RAM) and the like as conventionally known. On the front panel of the device there are provided switch means 217 connected to the input and output of the microcomputer 212 and a display means 218.

Figure 4:
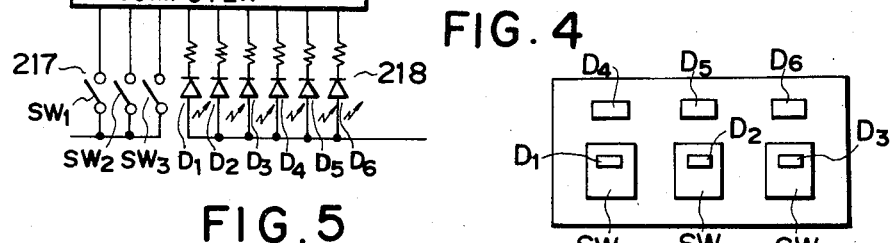
FIG. 4 shows an example of the front panel in the embodiment as shown in FIG. 3.

The front panel is shown in FIG. 4. The reference numerals SW$_1$–SW$_3$ designate switches comprising the above switch means 217. The switches SW$_1$ and SW$_2$ of the switches, for example, may be used for tuning of the first and second stations and their respective frequency selection (the first station: 3.925 MHz, 6.055 MHz, 9.595 MHz, the second station: 3.945 MHz, 6.115 MHz, 9.760 MHz), and on the other hand, the switch SW$_3$ for automatic tuning.

The reference numerals D$_1$–D$_6$ designate display elements, luminous diodes, for example, which comprises the display means 218. The diodes D$_1$, D$_2$ and D$_3$ are arranged to be relative to the switches SW$_1$, SW$_2$ and SW$_3$, and, the diodes D$_4$–D$_6$ display the respective frequency of the selected station.

The receiver according to the present invention as shown in FIG. 3 is of a PLL synthesizor system, so that a frequency to be received can be determined by applying predetermined data to the frequency divider 213 in the PLL circuit 211 from the microcomputer 212. For example, upon preliminarily putting data corresponding to each one of the frequencies in the ROM of the microcomputer 212, desired data may be read at each time by the switches $SW_1$ and $SW_2$ to be thereby displayed by the display means 218.

When the switch $SW_3$ is turned on, whereby the device is set in its automatic tuning mode, an electric field intensity then detected in the signal detector 208 and the reference level of the reference signal level setting circuit 209 are submitted to comparison in the comparator 207. Accordingly in response to the result, the microcomputer 212 is supplied with a signal showing whether the change of frequency should be carried out or not. At the time of switching the muting circuit 205 starts to operate with the output from the microcomputer 212.

The input and output relation between the microcomputer 212 and the switch means 217 or the display means 218 may consist of a routine for carrying out various operations in response to a memory of the random-access memory which memorizes what switch has been turned on and a routine for displaying modes and frequencies.

With respect to the initial setting upon turning on the power source switch, an automatic tuning routine may be carried out by forcedly making the random-access memory memorize as if the automatic tuning mode switch $SW_3$ were turned on.

Thus, the device is set in its automatic tuning mode by turning on the power switch to thereby receive the frequency of 3.925 MHz of the first station of the short wave broadcasting. In this mode, the switching to another wave in a better receivable condition takes place if the electric field intensity of the presently received wave becomes lower than the reference level.

Under such condition, when it is desired to receive the second station, the switch $SW_2$ may be turned on. When the display element $D_3$ for automatic tuning is set in its on condition, the automatic tuning mode is cancelled by turning the automatic tuning mode switch $SW_3$ on. On the other hand, when the display element $D_3$ is kept off, the device is set in its automatic tuning mode by turning the switch $SW_3$.

When the display element $D_1$ for the first station is set in its on condition, the wave switching of the first station can be carried out simply by pushing the switch $SW_1$. On this occasion, all a user has to do in order to receive the second station is to push the switch $SW_2$, and, by pushing it 2 times consecutively the wave switching of the second station can be carried out. Incidentally, the operation of the switches $SW_1$ and $SW_2$ does not affect the automatic tuning mode in any way.

Figure 5:
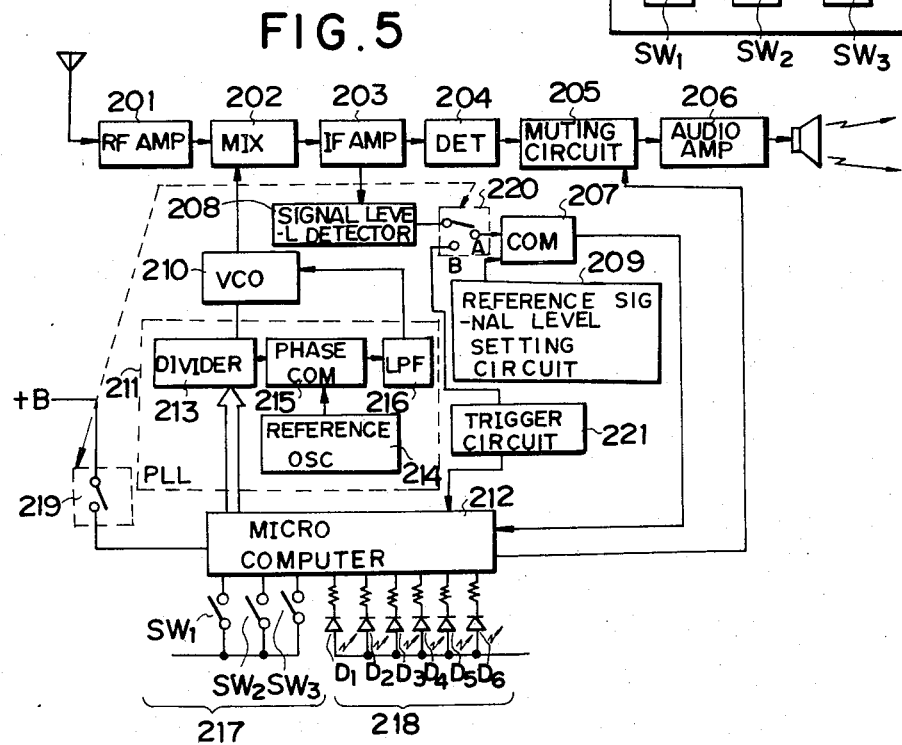
FIG. 5 shows a modification of the embodiment as shown in FIG. 3.

FIG. 5 shows a further improved embodiment on the basis of that as shown in FIG. 3.

In FIG. 5, the reference numeral 219 designates a switch, 220 a second switch which is arranged to operate in accordance with the switch 219 and disposed between the comparator 207 and the signal level detector 208, and, 221 a trigger circuit. The switch 219 is connected to the input and output of the microcomputer 212 like as the switches $SW_1$-$SW_3$, to thereby operate as a receiver exclusively used for a short wave broadcasting as mentioned above. The second switch 220 which operates in accordance with the switch 219 is connected to the contact A when the switch 219 is turned off. Accordingly, in order that the device is put in its automatic tuning mode when the switch $SW_3$ is pushed, the output of the signal detector 208 is applied to the comparator 207 together with the signal from the reference signal level setting circuit 209 to be thereby compared, and then, the microcomputer 212 operates subject to the necessary program routine in response to the result of the comparison.

When the switch 219 is turned on, the fact is memorized in the random-access memory of the microcomputer 212 to thereby cause a program routine in which the operation is carried out according to the memory. In this occasion, the second switch 220 is simultaneously changed up, thus being connected to the contact B which is led to the trigger circuit 221. The switches $SW_1$, $SW_2$ are arranged to have up and down functions for selecting a frequency to be received, and, the switch $SW_3$ is arranged to have automatic and manual function, respectively, when the switch 219 is turned on as mentioned above.

That is, when the $SW_1$ is pushed under the condition that the switch $SW_3$ has been set to have its manual function, the switch $SW_1$ starts frequency selection toward the upward direction at every predetermined frequency step, 5 KHz (international standard), for example because the switch $SW_1$ has the up-function. On the other hand, when the switch $SW_2$ is pushed, the switch $SW_2$ starts frequency selection toward the downward direction at every predetermined frequency step, 5 KHz, for example, with its down-function. Therefore, it is capable of carrying out frequency selecting operation at every 5 KHz step by pushing the switches $SW_1$ and $SW_2$, thus enabling selection of a frequency to be received continuously over the range of frequencies between about 3.9 MHz and 9.8 MHz, resulting in receiving a desired short wave broadcasting.

Further, if the switch $SW_3$ is set so as to have its automatic function, when a frequency having an electric field intensity more intensive than a predetermined level has been found as a result of the selection over the above mentioned range of frequencies, the device automatically keeps the position with the function of the trigger circuit 221. In this case, the switches $SW_1$ and $SW_2$ have the same function as mentioned above.

As described above, according to the present embodiment in which there are provided the microcomputer and the switches in order to control a short wave radio broadcasting and other short wave broadcasting, the switches being arranged to enable the device to alternatively receive each of the two stations, not only the short wave radio broadcasting which is conventionally received but also other FEN broadcasting, the Peking broadcasting, the Moscow broadcasting, the NHK broadcasting and the like can be received, without causing any damage against the tuning function of the short wave radio broadcasting.

That is, according to the embodiment, it is capable of receiving a large number of broadcastings, because the switches $SW_1$ and $SW_2$ each is arranged to have frequency selecting function not only of 6 frequencies of the short wave radio broadcastings, i.e., the first station (3.925 MHz, 6.055 MHz, 9.595 MHz) and the second station (3.945 MHz, 6.115 MHz, 9.760 MHz), but also of frequencies of other short waves at every 5 KHz step.

As clearly understood from the above description, the present invention is capable of always receiving the most preferable wave by automatically selecting a wave in a well receivable condition, and, the tuning can be done well because a PLL system is adopted.

We claim:

1. A tuner control system which comprises:
   a radio receiver means;
   a detector for detecting a signal level of a wave received by said radio receiver means;
   a means for setting a reference signal level;
   a comparator means for comparing a detected signal level with said reference signal level;
   a switching means for switching tuning frequency of waves received by said radio receiver means;
   a control means for controlling the operation of said switching means in response to a result of the comparison in said comparator means and to a predetermined wave condition, in which
   said reference signal level setting means has a high reference signal level setting circuit and a low reference signal level setting circuit;
   said comparator means comprises a first comparator and a second comparator;
   said first comparator is arranged to compare a detected signal level with said reference signal level,
   said control means is arranged to operate said switching means when said detected signal level is lower than said low reference signal level,
   said second comparator is arranged to compare said detected signal level with said high reference signal level, and
   said control means has first and second counters and a digital comparator, said first counter being arranged to count the number of times when said signal level was lower than said reference signal level, said second counter to count the number of times when said signal level was higher, respectively, and, said digital comparator being arranged to compare the counts of said first and second counters therebetween.

2. A tuner control system as claimed in claim 1 further comprising:
   a muting means for muting outputs of said radio receiver means; and
   a muting control means for controlling the operation of said muting means in response to a result of comparison in said comparator means and to a predetermined wave condition.

3. A tuner control system as claimed in claim 1 further comprising:
   a timer means; and
   an operating means for operating said timer means when said signal level is lower than said low reference signal level.

* * * * *